United States Patent
Ohtake et al.

(10) Patent No.: US 11,738,415 B2
(45) Date of Patent: Aug. 29, 2023

(54) FLUX, SOLDER PASTE AND METHOD FOR PRODUCING SOLDERED PRODUCT

(71) Applicant: SENJU METAL INDUSTRY CO., LTD., Tokyo (JP)

(72) Inventors: Takafumi Ohtake, Tokyo (JP); Hiroaki Kawamata, Tokyo (JP); Shinji Kikuchi, Tokyo (JP); Keisuke Shinozaki, Tokyo (JP); Yuki Fujino, Tokyo (JP); Kazuya Kitazawa, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/793,565

(22) PCT Filed: Mar. 22, 2021

(86) PCT No.: PCT/JP2021/011763
§ 371 (c)(1),
(2) Date: Jul. 18, 2022

(87) PCT Pub. No.: WO2021/200345
PCT Pub. Date: Oct. 7, 2021

(65) Prior Publication Data
US 2023/0107101 A1    Apr. 6, 2023

(30) Foreign Application Priority Data
Mar. 30, 2020  (JP) ................ 2020-060307

(51) Int. Cl.
*B23K 35/36* (2006.01)
*B23K 35/362* (2006.01)
*B23K 35/02* (2006.01)
*B23K 101/42* (2006.01)

(52) U.S. Cl.
CPC ........ *B23K 35/362* (2013.01); *B23K 35/3612* (2013.01); *B23K 35/025* (2013.01); *B23K 2101/42* (2018.08)

(58) Field of Classification Search
None
See application file for complete search history.

(56) References Cited

U.S. PATENT DOCUMENTS

| 4,670,298 A | 6/1987 | Lucas et al. |
| 2019/0009375 A1 | 1/2019 | Hayashi et al. |

FOREIGN PATENT DOCUMENTS

| JP | 2017-64730 A | 4/2017 | |
| TW | 201718163 A | 6/2017 | |
| WO | WO-2009013210 A1 * | 1/2009 | ......... B23K 35/3612 |

OTHER PUBLICATIONS

International Search Report issued by the Japan Patent Office for corresponding International Patent Application No. PCT/JP2021/011763, dated Jun. 1, 2021, with an English translation.
Initial Examination Opinion Notice issued by the Taiwan Patent Office for corresponding Taiwan Patent Application No. 110108957, dated Sep. 3, 2021, with a partial English machine translation.

* cited by examiner

*Primary Examiner* — Devang R Patel
(74) *Attorney, Agent, or Firm* — Myers Wolin, LLC

(57) ABSTRACT

A flux for soldering contains 10 to 40 wt % of coumarin, 5 to 30 wt % of a monoamide-based thixotropic agent and 40 to 80 wt % of a solvent. A solder paste contains the flux and a solder powder. A method for producing a soldered product includes supplying the solder paste to a soldering portion of an electronic circuit board, mounting an electronic component onto the soldering portion and heating the soldering portion up to a temperature at which the solder powder melts in a reducing atmosphere containing a reducing gas to join the electronic component and the electronic circuit board.

12 Claims, 1 Drawing Sheet

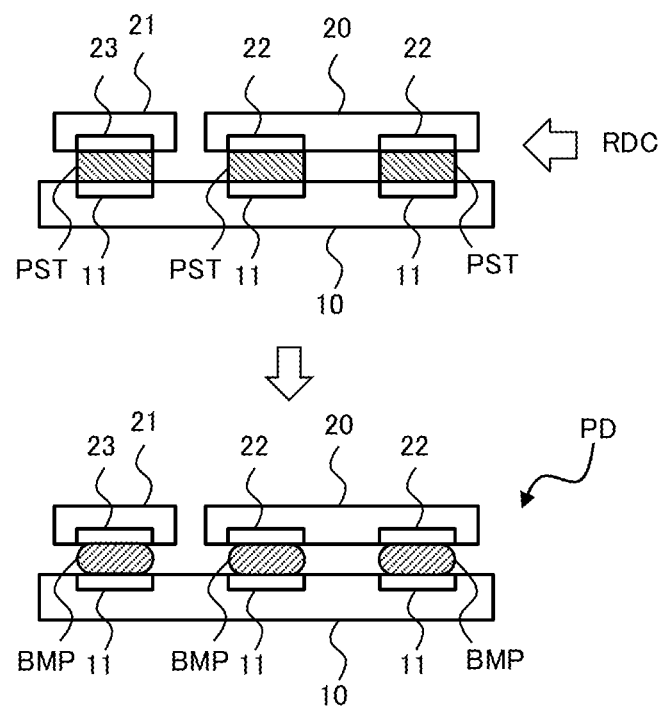

FLUX, SOLDER PASTE AND METHOD FOR PRODUCING SOLDERED PRODUCT

CROSS-REFERENCE TO RELATED APPLICATION

This application is a national stage application of International Application No. PCT/JP2021/011763, filed on Mar. 22, 2021 and designated the U.S., which claims priority to Japanese Patent Application No. 2020-060307, filed on Mar. 30, 2020. The contents of each are herein incorporated by reference.

FIELD

The present disclosure relates to a flux that is used in soldering, a solder paste using the flux, and a method for producing a soldered product using the solder paste.

BACKGROUND

Recently, in mounting of electronic components, reflow soldering has been carried out in which solder applied or attached to an electronic circuit board at normal temperature is later heated and used for soldering. In the case of reflow soldering using a solder paste, a solder paste containing a solder powder and a flux is applied to a soldering portion, and the solder powder is melted by heating the soldering portion.

Examples of components of the flux contained in the solder paste include a base resin, an additive and a solvent. The base resin fixes a soldered target to the electronic circuit board and also functions as an insulating body. Examples of the additive include a reducing agent, an activator and a thixotropic agent. The reducing agent removes an oxide film on the surface of the solder powder or on the surface of a soldering target. The activator removes the oxide film or improves the reducibility by the reducing agent and the wetting properties of molten solder. The thixotropic agent imparts thixotropy to the flux and the solder paste.

PTLs 1 and 2 are literatures relating to the present application. PTL 1 discloses a flux containing a base resin, an activator, a coumarin derivative and a solvent. The coumarin derivative has coumarin, which has light-emitting characteristics, as a basic skeleton and has excellent light-emitting characteristics by being dissolved in the solvent. As evidence therefor, PTL 1 discloses a test in which whether or not a residue derived from a component of the flux (flux residue) could be differentiated was evaluated.

According to the result of this test, it has been reported that, in a solder paste containing a flux containing a coumarin derivative (Example 4), a flux residue could be easily differentiated compared with a solder paste containing a flux containing coumarin (Comparative Example 2). In Example 4, the coumarin derivative used was 7-diethylamino-4-methylcoumarin.

PTL 2 discloses a solder paste containing a flux and containing a coumarin derivative. This coumarin derivative is the same compound as the coumarin derivative used in Example 4 of PTL 1. Therefore, according to reflow soldering using the solder paste of PTL 2, it is expected that the same evaluation result as in Example 4 of PTL 1 can be obtained.

CITATION LIST

Patent Literature

[PTL 1] JP 2017-64730 A
[PTL 2] U.S. Pat. No. 4,670,298

SUMMARY

Technical Problem

The techniques of PTLs 1 and 2 specify the flux residue on an electronic circuit board. It should be noted that, in reflow soldering a flux residue degrades insulation reliability, which is problematic. In addition, the flux residue peels off from the electronic circuit board in a step after the reflow soldering (for example, molding step) and causes a variety of disadvantages, which is problematic.

The present inventors studied fluxes containing coumarin from the viewpoint of reducing flux residues. Coumarin is a compound that is solid at normal temperature, but has high sublimability. Thus, solder pastes containing a flux containing coumarin have been expected to reduce flux residues.

However, it has been clarified that, depending on the proportion of coumarin contained, coumarin and a solder powder are likely to separate from each other in the solder pastes. Once the separation occurs, the supply properties of the solder paste at the time of reflow soldering deteriorate. Thus, for fluxes containing coumarin, there is room for improvement from the viewpoint of the supply stability of solder pastes.

An object of the present disclosure is to provide a flux for soldering capable of reducing flux residues and suppressing the deterioration of the supply stability of solder pastes, a solder paste and a method for producing a soldered product.

Solution to Problem

The present inventors have found that a combination of coumarin with a monoamide-based thixotropic agent can suppress separation in the solder paste. As a result of further studies, it was found that when content ratios of coumarin, monoamide thixotropic agent, and solvent are in appropriate ranges, separation is suppressed and the flux residue is sufficiently reduced, and thus, the present inventors have completed the present disclosure.

A first disclosure is a flux for soldering and has the following feature.

The flux comprises 10 to 40 wt % of coumarin, 5 to 30 wt % of a monoamide-based thixotropic agent, and 40 to 80 wt % of a solvent.

A second disclosure further has the following feature in the first disclosure.

A lower limit of a content proportion of the coumarin is 15 wt %.

A third disclosure further has the following feature in the first or second disclosure.

An upper limit of a content proportion of the coumarin is 25 wt %.

A fourth disclosure further has the following feature in any one of the first to third disclosure.

A lower limit of a content proportion of the monoamide-based thixotropic agent is 15 wt %.

A fifth disclosure further has the following feature in any one of the first to fourth disclosure.

An upper limit of a content proportion of the monoamide-based thixotropic agent is 25 wt %.

A sixth disclosure further has the following feature in any one of the first to fifth disclosure e.

A content ratio of the coumarin to the monoamide-based thixotropic agent is 0.4 to 8.0.

A seventh disclosure further has the following feature in any one of the first to sixth disclosure.

The flux further comprises more than 0 wt % and 5 wt % or less of an activator.

An eighth disclosure further has the following feature in any one of the first to sixth disclosure.

The flux comprises no activator.

A ninth disclosure further has the following feature in any one of the first to eighth disclosure.

The flux further comprises more than 0 wt % and 5 wt % or less of rosin.

A tenth disclosure further has the following feature in any one of the first to eighth disclosure.

The flux comprises no rosin.

An eleventh disclosure is a solder paste and has the following feature.

The solder paste comprises the flux according to any one of the first to tenth disclosures and a solder powder.

A twelfth disclosure is a method for producing a soldered product and has the following feature.

The method comprises a step of supplying the solder paste according to the eleventh disclosure to a soldering portion of an electronic circuit board, a step of mounting an electronic component onto the soldering portion, and a step of heating the soldering portion up to a temperature at which the solder powder melts in a reducing atmosphere containing a reducing gas to join the electronic component and the electronic circuit board.

BRIEF DESCRIPTION OF DRAWINGS

FIG. 1 is an example for illustrating a method for producing a soldered product according to an embodiment.

DESCRIPTION OF EMBODIMENTS

An embodiment of the present disclosure will be described in detail below. In the present specification, "wt %" means "mass %." In addition, wt % of a component that constitutes a flux is based on the mass of the entire flux. In addition, in a case where a numerical range is expressed using "to," the range is regarded as including numerical numbers at both ends.

1. Flux

A flux according to the embodiment is a flux for soldering. The flux according to the embodiment is preferably used in reflow soldering that is carried out in an atmosphere containing a reducing gas. The details of this reflow soldering will be described in "3. Method for producing soldered product." The flux according to the embodiment contains coumarin, a monoamide-based thixotropic agent and a solvent as essential components. Hereinafter, the essential components and content proportions (contents) thereof will be described.

1-1. Coumarin

Coumarin is a compound that is represented by the following general formula (I) and is solid at normal temperature (25° C.). Coumarin is added to stabilize the states of solder pastes and to secure the volatility of the flux at the time of reflow soldering.

[Formula 1]

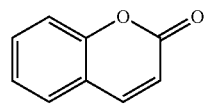

(I)

The content proportion of coumarin in the entire flux is 10 to 40 wt %. When the content proportion of coumarin is small, separation of the flux and the solder powder is likely to occur during the storage of a solder paste. Once the separation of the solder paste occurs, since the state of the solder paste becomes unstable, the supply of the solder paste to electronic circuit boards becomes difficult. Therefore, from this viewpoint, the lower limit of the content proportion of coumarin is preferably 15 wt %. In addition, when the content proportion of coumarin becomes large, the viscosity of the solder paste becomes high, and the supply of the solder paste to electronic circuit boards becomes difficult. Therefore, the upper limit of the content proportion of coumarin is preferably 25 wt %.

1-2. Monoamide-Based Thixotropic Agent

The monoamide-based thixotropic agent is added to impart thixotropy to the flux containing coumarin and thereby stabilizing the states of solder pastes. As the monoamide-based thixotropic agent, a fatty acid amide and an aromatic amide are exemplified. The monoamide-based thixotropic agent is used singly or a plurality of kinds are mixed and used.

As the aliphatic amide, acetamide, propionamide, butyramide, isobutyramide, hexanamide, octanamide, 2-ethylhexanamide, oleamide, stearamide, laurylamide, behenamide, palmitamide, erucamide and hydroxystearic acid amide are exemplified. As the aromatic amide, benzamide, 2-phenylacetamide and 4-methylbenzamide (p-toluamide) are exemplified.

The content proportion of the monoamide-based thixotropic agent in the entire flux (in a case where a plurality of kinds of monoamide-based thixotropic agents are mixed and used, the total content proportion of these thixotropic agents) is 5 to 30 wt %. From the viewpoint of sufficiently suppressing separation of solder pastes, the lower limit of the content proportion of the monoamide-based thixotropic agent is preferably 15 wt %. On the other hand, when the content proportion of the monoamide-based thixotropic agent becomes large, it becomes impossible to fully volatile the monoamide-based thixotropic agent at the time of reflow soldering. The monoamide-based thixotropic agent that has not been volatilized becomes a cause for the generation of a flux residue or voids. From this viewpoint, the upper limit of the content proportion of the monoamide-based thixotropic agent is preferably 25 wt %.

1-3. Solvent

As the solvent that is added to the flux containing coumarin and the monoamide-based thixotropic agent, a liquid solvent and a solid solvent are exemplified. The liquid solvent is used singly or a plurality of kinds are mixed and used. The solid solvent is mixed with the liquid solvent and used.

As the liquid solvent, an alcohol-based solvent and a glycol-based solvent are exemplified. As the alcohol-based solvent, isopropyl alcohol, terpineol, isobornyl cyclohexanol, isohexadecanol, isoheptadecanol, isooctadecanol, isononadecanol, isoeicosanol, dihydroterpineol and the like are exemplified.

As the glycol-based solvent, ethylene glycol, diethylene glycol, triethylene glycol, tetraethylene glycol, propylene glycol, dipropylene glycol, tripropylene glycol, tetrapropylene glycol, 1,3-propanediol, 1,2-butanediol, 1,3-butanediol, 1,4-butanediol, 2-methyl-1,3-propanediol, 1,2-pentanediol, 1,3-pentanediol, 1,4-pentanediol, 1,5-pentanediol and neopentyl glycol are exemplified.

As the solid solvent, a hydroxy compound that is solid at normal temperature (25° C.) and has a boiling point of 155 to 270° C. is exemplified. As such a hydroxy compound, 2-ethyl-2-hydroxymethyl-1,3-propanediol (another name: trimethylolpropane), 2-ethyl-2-methyl-1,3-propanediol, 2-butyl-2-ethyl-1,3-propanediol, 2-ethyl-2-propyl-1,3-propanediol, 2,2-dimethyl-1,3-propanediol and 2,5-dimethylhexane-2,5-diol are exemplified.

1-4. Ratio RT of Content Proportion of Coumarin to Content Proportion of Monoamide-Based Thixotropic Agent In the flux according to the embodiment, the content proportion of coumarin and that of the monoamide-based thixotropic agent are as described above. Here, from the results of Examples to be described below, the relationship between these content proportions preferably satisfies the following relationship (1).

$$0.4 \leq \text{Ratio } RT \leq 8.0 \quad (1)$$

The flux in which the content proportion of coumarin and that of the monoamide-based thixotropic agent are within the above-described ranges and satisfy the above-described relationship (1) is preferable from the viewpoint of securing the supply stability of solder pastes and the volatility of the flux. From the viewpoint of improving the supply stability and the volatility, the ratio RT more preferably satisfies the following relationship (2).

$$0.7 \leq \text{Ratio } RT \leq 1.0 \quad (2)$$

1-5. Activator

The flux according to the embodiment may contain an activator. That is, the flux according to the embodiment contains an activator as an arbitrary component. As the activator, an organic acid, an amine, an organic halogen compound and an amine hydrohalide are exemplified. The activator is used singly or a plurality of kinds are mixed and used.

As the organic acid, glutaric acid, adipic acid, azelaic acid, eicosanedioic acid, citric acid, glycolic acid, lactic acid, succinic acid, salicylic acid, diglycolic acid, dipicolinic acid, dibutylaniline diglycolic acid, suberic acid, sebacic acid, thioglycolic acid, phthalic acid, isophthalic acid, terephthalic acid, dodecanedioic acid, parahydroxyphenylacetic acid, picolinic acid, phenylsuccinic acid, fumaric acid, maleic acid, malonic acid, lauric acid, benzoic acid, tartaric acid, tris(2-carboxyethyl) isocyanurate, glycine, 1,3-cyclohexanedicarboxylic acid, 2,2-bis(hydroxymethyl)propionic acid, 2,2-bis(hydroxymethyl)butanoic acid, 4-tert-butylbenzoic acid, 2,3-dihydroxybenzoic acid, 2,4-diethylglutaric acid, 2-quinolinecarboxylic acid, 3-hydroxybenzoic acid, malic acid, p-anisic acid, palmitic acid, stearic acid, 12-hydroxystearic acid, oleic acid, linoleic acid, linolenic acid and the like are exemplified. As the organic acid, in addition, a dimer acid that is a reaction product of oleic acid and linoleic acid, a hydrogenated dimer acid containing hydrogen added to this dimer acid, a trimer acid that is a reaction product of oleic acid and linoleic acid, a hydrogenated trimer acid containing hydrogen added to this trimer acid, and the like are exemplified. As the organic acid, furthermore, a dimer acid other than a reaction product of oleic acid and linoleic acid, a hydrogenated dimer acid containing hydrogen added to this dimer acid, a trimer acid other than a reaction product of oleic acid and linoleic acid, a hydrogenated trimer acid containing hydrogen added to this trimer acid, and the like are exemplified.

As the amine, imidazoles such as imidazole, 2-methylimidazole, 2-ethylimidazole, 2-ethyl-4-methylimidazole and 1-benzyl-2-phenylimidazole are exemplified. As the amine, in addition, aliphatic amines such as methylamine, ethylamine, dimethylamine, 1-aminopropane, isopropylamine, trimethylamine, n-ethylmethylamine, allylamine, n-butylamine, diethylamine, sec-butylamine, tert-butylamine, N,N-dimethylethylamine, isobutylamine, pyrrolidine, 3-pyrroline, n-pentylamine, dimethylaminopropane, 1-aminohexane, triethylamine, diisopropylamine, dipropylamine, hexamethyleneimine, 1-methylpiperidine, 2-methylpiperidine, 4-methylpiperidine, cyclohexylamine, diallylamine, n-octylamine, aminomethylcyclohexane, 2-ethylhexylamine, dibutylamine, diisobutylamine, 1,1,3,3-tetramethylbutylamine, 1-cyclohexylethylamine and N,N-dimethylcyclohexylamine are exemplified. As the amine, furthermore, aromatic amines such as aniline, diethylaniline, pyridine, diphenylguanidine and ditolylguanidine are exemplified. As the amine, furthermore, amino alcohols such as 2-ethylaminoethanol, diethanolamine, diisopropanolamine, N-butyldiethanolamine, triisopropanolamine, N,N-bis(2-hydroxyethyl)-N-cyclohexylamine and triethanolamine are exemplified. As the amine, furthermore, polyoxyalkylene-type alkylamines such as polyoxyalkylene alkylamine, polyoxyalkylene ethylenediamine and polyoxyalkylene diethylenetriamine are exemplified. As the amine, furthermore, terminal amine polyoxyalkylenes such as a terminal aminopolyethylene glycol-polypropylene glycol copolymer (terminal amino PEG-PPG copolymer) are exemplified.

As the organic halogen compound, organic bromo compounds such as trans-2,3-dibromo-1,4-butenediol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, 2,3-dibromo-2-butene-1,4-diol, trans-2,3-dibromo-2-butene-1,4-diol, cis-2,3-dibromo-2-butene-1,4-diol, tetrabromophthalic acid, bromosuccinic acid and 2,2,2-tribromoethanol are exemplified. As the organic halogen compound, in addition, organic chloro compounds such as a chloroalkane, a chlorinated fatty acid ester, chlorendic acid and a chlorendic anhydride are exemplified. As the organic halogen compound, furthermore, a fluorine-based surfactant, a surfactant having a perfluoroalkyl group, and an organic fluoro compound such as polytetrafluoroethylene are exemplified.

The amine hydrohalide is a compound obtained by reacting an amine and a hydrogen halide. As the amine hydrohalide, stearylamine hydrochloride, diethylaniline hydrochloride, diethanolamine hydrochloride, 2-ethylhexylamine hydrobromide, pyridine hydrobromide, isopropylamine hydrobromide, cyclohexylamine hydrobromide, diethylamine hydrobromide, monoethylamine hydrobromide, 1,3-diphenylguanidine hydrobromide, dimethylamine hydrobromide, dimethylamine hydrochloride, rosin amine hydrobromide, 2-ethylhexylamine hydrochloride, isopropylamine hydrochloride, cyclohexylamine hydrochloride, 2-pipecholine hydrobromide, 1,3-diphenylguanidine hydrochloride, dimethylbenzylamine hydrochloride, hydrazinehydrate hydrobromide, dimethylcyclohexylamine hydrochloride, trinonylamine hydrobromide, diethylaniline hydrobromide, 2-diethylaminoethanol hydrobromide, 2-diethylaminoethanol hydrochloride, ammonium chloride, diallylamine hydrochloride, diallylamine hydrobromide, monoethylamine hydrochloride, monoethylamine hydrobromide, diethylamine hydrochloride, triethylamine hydrobromide, triethylamine hydrochloride, hydrazine monohydrochloride, hydrazine dihydrochloride, hydrazine monohydrobromide, hydrazine dihydrobromide, pyridine hydrochloride, aniline hydrobromide, butylamine hydrochloride, hexylamine hydrochloride, n-octylamine hydrochloride, dodecylamine hydrochloride, dimethylcyclohexylamine hydrobromide, ethylenediamine dihydrobromide, rosin amine hydrobromide, 2-phenylimidazole hydrobromide, 4-benzylpyridine hydrobromide, L-glutamine hydrochloride, N-methylmorpholin hydrochloride, betaine hydrochloride, 2-pipecholine hydroiodide, cyclohexylamine hydroiodide, 1,3-diphenylguanidine hydrofluoride, diethylamine hydrofluoride, 2-ethylhexylamine hydrofluoride, cyclohexylamine hydrofluoride, ethylamine hydrofluoride, rosin amine hydrofluoride, cyclohexylamine tetrafluoroborate and dicyclohexylamine tetrafluoroborate are exemplified.

The content proportion of the activator based on the total mass of the flux (in a case where a plurality of kinds of activators are mixed and used, the total content proportion of these activators) is preferably more than 0 wt % and 5 wt % or less. When the content proportion of the activator is within this numerical range, it is possible to prevent the activator contained in the flux from being not fully volatilized at the time of reflow soldering and acting as a cause for the generation of a flux residue or voids. In a case where the content proportion of the activator is 0 wt %, that is, the flux does not contain the activator, there is no need to take the above-described influence into account, which is preferable.

1-6. Rosin

The flux according to the embodiment may contain rosin. That is, the flux according to the embodiment contains rosin as an arbitrary component. The rosin is used singly or a plurality of kinds are mixed and used.

The rosin is a non-volatile component that is contained in pine resins of Pinaceae plants or the like. The rosin includes raw material rosin such as gum rosin, wood rosin or tall oil rosin and a derivative obtained from the raw material rosin. As the derivative, purified rosin, hydrogenated rosin, disproportionated rosin, polymerized rosin and an α,β-unsaturated carboxylic acid modified product (for example, acrylic acid-modified rosin, maleic acid-modified rosin or fumaric acid-modified rosin) are exemplified. As the derivative, in addition, a purified product, hydrogenated product and disproportionated product of polymerized rosin are exemplified. As the derivative, in addition, a purified product, hydrogenated product and disproportionated product of α,β-unsaturated carboxylic acid modified product are exemplified.

The content proportion of the rosin based on the total mass of the flux (in a case where a plurality of kinds of rosin are mixed and used, the total content proportion of the rosin) is preferably more than 0 wt % and 5 wt % or less. When the content proportion of the rosin is within this numerical range, it is possible to prevent the rosin contained in the flux from being not fully volatilized at the time of reflow soldering and acting as a cause for the generation of a flux residue or voids. In a case where the content proportion of the rosin is 0 wt %, that is, the flux does not contain the rosin, there is no need to take the above-described influence into account, which is preferable.

1-7. Method for Producing Flux

A method for producing the flux according to the embodiment is not limited, and the flux is produced by mixing the raw materials simultaneously or sequentially by an arbitrary method. In the production of the flux, all of the components of the flux need to be mixed in the end. That is, in a case where an arbitrary component is contained in the flux, the essential components may be mixed in advance or some of the essential components may be mixed with the arbitrary component and then the rest of the essential components may be further mixed. Furthermore, all of the components of the flux may be mixed simultaneously.

2. Solder Paste

A solder paste according to the embodiment contains the above-described flux and solder powder.

2-1. Solder Powder

The composition of the solder powder that is used in the solder paste is not particularly limited, and a variety of kinds of solder alloys can be used as the solder powder. As such solder alloys, a two-component alloy and a multicomponent (three or more-component) alloy are exemplified. As the two-component alloy, a Sn—Sb-based alloy, a Sn—Pb-based alloy, a Sn—Cu-based alloy, a Sn—Ag-based alloy, a Sn—Bi-based alloy and a Sn—In-based alloy are exemplified. As the multicomponent alloy, a Sn—Pb-M-based alloy (M is one or more metals selected from the group consisting of Bi, Cu, In, Sb and Ag), a Sn—Zn-M-based alloy (M is one or more metals selected from the group consisting of Bi, Cu, In, Sb and Ag) and a Sn—Ag-M-based alloy (M is one or more metals selected from the group consisting of Bi, Cu, In, Sb and Zn) are exemplified.

The content proportions of the solder powder and the flux based on the total mass of the solder paste are not limited. For example, the content proportion of the solder powder is 5 to 95 mass %, and that of the flux is 5 to 95 mass %.

2-2. Method for Producing Solder Paste

A method for producing the solder paste according to the embodiment is not limited, and the solder paste is produced by mixing the raw materials simultaneously or sequentially by an arbitrary method. In the production of the solder paste, all of the components of the flux and the solder powder need to be mixed in the end. That is, the solder powder may be mixed with all of the components of the flux that have been prepared in advance or some of the components of the flux may be mixed with the solder powder and then the remaining components of the flux may be further mixed. Furthermore, all of the components of the solder paste may be mixed simultaneously.

3. Method for Producing Soldered Product

FIG. 1 is a view describing an example of a method for producing a soldered product according to the embodiment. FIG. 1 shows the flow of reflow soldering that is carried out under a reducing atmosphere containing a reducing gas. The reducing gas is composed of a reducing substance (for example, formic acid or hydrogen) that removes an oxide film formed on the surface of solder powder that constitutes a solder paste PST and oxide films formed on the surfaces of electrodes 11 in an electronic circuit board 10.

In the reflow soldering shown in FIG. 1, first, the solder paste PST is supplied to the surfaces of the electrodes 11, which are soldering portions, (step S1). The supply of the solder paste PST is carried out using a dispenser, a jet dispenser, a screen printer, a metal mask printer or the like. Therefore, a solder-supplied pattern is formed on the electronic circuit board 10.

Subsequently, electronic components 20 and 21 are mounted onto the solder-supplied pattern (step S2). As the electronic components 20 and 21, an IC chip is exemplified. The mounting of the electronic components 20 and 21 is carried out using a mounter or the like. Therefore, electrodes 22 that are soldering portions of the electronic component 20 and an electrode 23 that is a soldering portion of the electronic component 21 come into contact with the solder paste PST.

Subsequently, the electronic circuit board 10 is transported into a chamber (not shown). In addition, the temperature in the chamber is raised while a reducing gas RDC is introduced into the chamber (step S3). Before the introduction of the reducing gas RDC, it is preferable to substitute an air in the chamber with an inert gas while the inside of the chamber is depressurized and suctioned. The substitution of the air in the chamber with an inert gas while the inside of the chamber is depressurized makes it possible to prevent the surfaces of the electrodes 11, 22 and 23 from being oxidized again after the removal of the oxide films by the reducing gas RDC. In addition, it becomes possible to rapidly discharge to the outside of the chamber a material generated by a reduction reaction between the reducing gas RDC and the oxide films.

When the oxide films are removed by the reducing gas RDC that has arrived at the circumference of the solder paste PST, the metal surfaces are exposed. When the temperature in the chamber reaches a temperature higher than the melting point of the solder powder that constitutes the solder paste PST, the solder powder that is contained in the solder paste PST melts and becomes molten solder. The molten solder wets and spreads on the metal surfaces, whereby the molten solder and the electrodes (that is, the electrodes 11, 22 and 23) are joined together. After that, when the temperature in the chamber lowers to a temperature lower than the melting point, the molten solder hardens and becomes soldered joint portions BMP. Therefore, a soldered product PD is obtained.

4. Examples

Next, the flux and the solder paste according to the embodiment will be described in detail based on Examples.

Components shown in Table 1 were mixed in blending proportions shown in Table 1, thereby preparing fluxes of Examples 1 to 24 and fluxes of Comparative Examples 1 to 18. In the flux of Comparative Example 17, a coumarin derivative represented by the following general formula (II) was used. In the flux of Comparative Example 18, a coumarin derivative represented by the following general formula (III) was used.

[Formula 2]

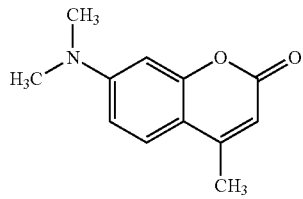

(II)

[Formula 3]

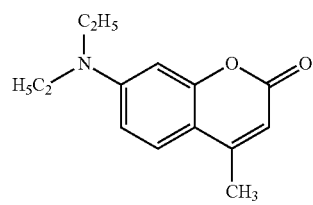

(III)

Each of the fluxes of the Examples and the Comparative Examples was mixed with a solder powder, thereby producing a sample of a solder paste. Specifically, each of the fluxes of the Examples and the Comparative Examples and solder powder having a composition of Sn-3.0Ag-0.5Cu (SAC305) were mixed in a mass ratio of flux:solder powder=13:87, thereby producing a solder paste. Next, regarding the fluxes of the Examples and the Comparative Examples, evaluation was carried out from the viewpoint of a property of suppressing the generation of a flux residue and a precipitate. In addition, regarding each sample of the solder paste, evaluation was carried out from the viewpoint of a property of suppressing the occurrence of separation during storage.

4-1. Property of Suppressing Generation of Flux Residue 10 mg of each of the fluxes of the Examples and the Comparative Examples was fed into an aluminum pan and heated up to 400° C. at a temperature rise rate of 10° C./min using a differential thermal balance (STA7200, manufactured by Hitachi High-Tech Science Corporation). The ratio of the weight of each flux at 250° C. to the weight before the heating was calculated, and this was defined as a residue rate.

The evaluation criteria of the property of suppressing the generation of a flux residue are as follows.

Good: The residue rate is 1% or less.

Poor: The residue rate is more than 1%.

4-2. Property of Suppressing Occurrence of Separation During Storage 30 to 40 g of each sample of the solder paste was loaded into a transparent syringe (PSY-10E, manufactured by Musashi Engineering, Inc.), and then stored at normal temperature for 72 hours with a plunger, a cap and a lid closed. After that, the status of the solder paste near the plunger was checked.

The evaluation criteria of the property of suppressing the occurrence of separation during storage are as follows.

Good: No cracking occurs.

Poor: Cracking occurs.

4-3. Comprehensive Evaluation

The comprehensive evaluation of the fluxes of the Examples and the Comparative Examples was carried out using the evaluation results of the above-described two items. The determination criteria of the comprehensive evaluation are as follows.

Good: The evaluation of the above-described two items is all good.

Poor: One or more of the evaluation of the above-described two items are poor.

The results of the comprehensive evaluation are shown in Tables 1 to 4 together with the evaluation results of the above-described two items.

TABLE 1

| | Material | 1 | 2 | 3 | 4 | 5 | 6 | 7 | 8 | 9 | 10 | 11 | 12 |
|---|---|---|---|---|---|---|---|---|---|---|---|---|---|
| Coumarin-based compound | Coumarin (CAS: 91-64-5) | 20 | 20 | 20 | 10 | 15 | 25 | 40 | 10 | 20 | 10 | 15 | 20 |
| | 7-Diethylamino-4-methylcoumarin (CAS: 91-44-1) | | | | | | | | | | | | |
| | 7-Dimethylamino-4-methylcoumarin (CAS: 87-01-4) | | | | | | | | | | | | |
| Monoamide-based thixotropic agent | Stearamide | 8 | | 4 | 10 | 6 | 5 | 2 | 15 | 8 | 8 | 8 | 4 |
| | Palmitamide | | 8 | 4 | | | | | | | | | 4 |
| | p-Toluamide | 12 | 12 | 12 | 15 | 14 | 10 | 3 | 15 | 12 | 12 | 12 | 12 |
| Solvent / Liquid solvent | Isobornyl cyclohexanol | 10 | 10 | 10 | 10 | 10 | 10 | 10 | 10 | 10 | 15 | 10 | 10 |
| | Isooctadecanol | 50 | 50 | 50 | 55 | 55 | 50 | 45 | 50 | | 30 | 50 | 20 |
| | Hexyl diglycol | | | | | | | | | 50 | | | 20 |
| Solid solvent | Trimethylolpropane | | | | | | | | | | 25 | | 5 |
| Activator | Adipic acid | | | | | | | | | | | | 1 |
| | 2-Ethylimidazole | | | | | | | | | | | | 1 |
| | 1,3-Diphenylguanidine hydrobromide | | | | | | | | | | | | 1 |
| | trans-2,3-Dibromo-2-buten-1,4-diol | | | | | | | | | | | | 1 |
| Rosin | Acrylic acid-modified hydrogenated rosin | | | | | | | | | | | 5 | 1 |
| | Total | 100 | 100 | 100 | 100 | 100 | 100 | 100 | 100 | 100 | 100 | 100 | 100 |
| | Total amount of monoamide-based thixotropic agents | 20 | 20 | 20 | 25 | 20 | 15 | 5 | 30 | 20 | 20 | 20 | 20 |
| | Amount of coumarin/Total amount of monoamide-based thixotropic agents | 1 | 1 | 1 | 0.4 | 0.75 | 1.67 | 8 | 0.33 | 1 | 0.5 | 0.75 | 1 |
| | Property of suppressing generation of flux residue | Good | Good | Good | Good | Good | Good | Good | Good | Good | Good | Good | Good |
| | Property of suppressing occurrence of separation during storage | Good | Good | Good | Good | Good | Good | Good | Good | Good | Good | Good | Good |
| | Comprehensive evaluation | Good | Good | Good | Good | Good | Good | Good | Good | Good | Good | Good | Good |

TABLE 2

| | Material | 13 | 14 | 15 | 16 | 17 | 18 | 19 | 20 | 21 | 22 | 23 | 24 |
|---|---|---|---|---|---|---|---|---|---|---|---|---|---|
| Coumarin-based compound | Coumarin (CAS: 91-64-5) | 20 | 20 | 20 | 19 | 20 | 10 | 10 | 40 | 10 | 10 | 10 | 10 |
| | 7-Diethylamino-4-methylcoumarin (CAS: 91-44-1) | | | | | | | | | | | | |
| | 7-Dimethylamino-4-methylcoumarin (CAS: 87-01-4) | | | | | | | | | | | | |
| Monoamide-based thixotropic agent | Stearamide | 20 | 8 | 8 | 8 | 8 | 10 | 8 | 2 | 4 | 4 | 4 | 4 |
| | Palmitamide | | | | | | | | | | | | |
| | p-Toluamide | | 12 | 12 | 12 | 12 | 15 | 12 | 3 | 6 | 6 | 6 | 6 |
| Solvent / Liquid solvent | Isobornyl cyclohexanol | 10 | 5 | 5 | 10 | 5 | 10 | 20 | | 20 | 20 | | |
| | Isooctadecanol | 50 | 50 | 50 | 50 | 50 | 55 | 50 | 40 | 60 | | | 80 |
| | Hexyl diglycol | | | | | | | | | | 60 | 80 | |
| Solid solvent | Trimethylolpropane | | | | | | | | 15 | | | | |
| Activator | Adipic acid | | 5 | | | | | | | | | | |
| | 2-Ethylimidazole | | | 5 | | | | | | | | | |
| | 1,3-Diphenylguanidine hydrobromide | | | | 1 | | | | | | | | |
| | trans-2,3-Dibromo-2-buten-1,4-diol | | | | | 5 | | | | | | | |
| Rosin | Acrylic acid-modified hydrogenated rosin | | | | | | | | | | | | |
| | Total | 100 | 100 | 100 | 100 | 100 | 100 | 100 | 100 | 100 | 100 | 100 | 100 |
| | Total amount of monoamide-based thixotropic agents | 20 | 20 | 20 | 20 | 20 | 25 | 20 | 5 | 10 | 10 | 10 | 10 |
| | Amount of coumarin/Total amount of monoamide-based thixotropic agents | 1 | 1 | 1 | 0.95 | 1 | 0.4 | 0.5 | 8 | 1 | 1 | 1 | 1 |
| | Property of suppressing generation of flux residue | Good | Good | Good | Good | Good | Good | Good | Good | Good | Good | Good | Good |
| | Property of suppressing occurrence of separation during storage | Good | Good | Good | Good | Good | Good | Good | Good | Good | Good | Good | Good |
| | Comprehensive evaluation | Good | Good | Good | Good | Good | Good | Good | Good | Good | Good | Good | Good |

TABLE 3

| | Material | Comparative Example 1 | 2 | 3 | 4 | 5 |
|---|---|---|---|---|---|---|
| Coumarin-based compound | Coumarin (CAS: 91-64-5) | 40 | 40 | 40 | 40 | 40 |
| | 7-Diethylamino-4-methylcoumarin (CAS: 91-44-1) | | | | | |

TABLE 3-continued

|  | Material | Comparative Example | | | | |
|---|---|---|---|---|---|---|
|  |  | 1 | 2 | 3 | 4 | 5 |
|  | 7-Dimethylamino-4-methylcoumarin (CAS: 87-01-4) |  |  |  |  |  |
| Monoamide-based thixotropic agent | Stearamide |  |  |  |  |  |
|  | Palmitamide |  |  |  |  |  |
|  | p-Toluamide |  |  |  |  |  |
| Solvent Liquid solvent | Isobornyl cyclohexanol | 10 | 10 | 10 | 14 | 10 |
|  | Isooctadecanol | 50 | 45 | 45 | 45 | 45 |
|  | Hexyl diglycol |  |  |  |  |  |
| Solid solvent | Trimethylolpropane |  |  |  |  |  |
| Activator | Adipic acid |  | 5 |  |  |  |
|  | 2-Ethylimidazole |  |  | 5 |  |  |
|  | 1,3-Diphenylguanidine hydrobromide |  |  |  | 1 |  |
|  | trans-2,3-Dibromo-2-buten-1,4-diol |  |  |  |  | 5 |
| Rosin | Acrylic acid-modified hydrogenated rosin |  |  |  |  |  |
|  | Total | 100 | 100 | 100 | 100 | 100 |
| Total amount of monoamide-based thixotropic agents |  | 0 | 0 | 0 | 0 | 0 |
| Amount of coumarin/ Total amount of monoamide-based thixotropic agents |  | — | — | — | — | — |
| Property of suppressing generation of flux residue |  | Good | Good | Good | Good | Good |
| Property of suppressing occurrence of separation during storage |  | Poor | Poor | Poor | Poor | Poor |
| Comprehensive evaluation |  | Poor | Poor | Poor | Poor | Poor |

TABLE 4

|  | Material | Comparative Example | | | | | | | | | | | | |
|---|---|---|---|---|---|---|---|---|---|---|---|---|---|---|
|  |  | 6 | 7 | 8 | 9 | 10 | 11 | 12 | 13 | 14 | 15 | 16 | 17 | 18 |
| Coumarin-based compound | Coumarin (CAS: 91-64-5) |  |  |  |  |  | 5 | 10 | 10 | 10 | 10 | 10 |  |  |
|  | 7-Diethylamino-4-methylcoumarin (CAS: 91-44-1) |  |  |  |  |  |  |  |  |  |  |  | 20 |  |
|  | 7-Dimethylamino-4-methylcoumarin (CAS: 87-01-4) |  |  |  |  |  |  |  |  |  |  |  |  | 20 |
| Monoamide-based thixotropic agent | Stearamide | 10 | 10 | 10 | 10 | 10 | 10 | 8 | 8 | 8 | 8 | 8 | 8 | 8 |
|  | Palmitamide |  |  |  |  |  |  |  |  |  |  |  |  |  |
|  | p-Toluamide | 30 | 30 | 30 | 30 | 30 | 30 | 12 | 12 | 12 | 12 | 12 | 12 | 12 |
| Solvent Liquid solvent | Isobornyl cyclohexanol | 10 | 10 | 10 | 14 | 10 | 10 | 10 | 10 | 10 | 10 | 10 | 10 | 10 |
|  | Isooctadecanol | 50 | 45 | 45 | 45 | 45 | 45 | 50 | 50 | 50 | 50 | 50 | 50 | 50 |
|  | Hexyl diglycol |  |  |  |  |  |  |  |  |  |  |  |  |  |
| Solid solvent | Trimethylolpropane |  |  |  |  |  |  |  |  |  |  |  |  |  |
| Activator | Adipic acid |  | 5 |  |  |  |  | 10 |  |  |  |  |  |  |
|  | 2-Ethylimidazole |  |  | 5 |  |  |  |  | 10 |  |  |  |  |  |
|  | 1,3-Diphenylguanidine hydrobromide |  |  |  | 1 |  |  |  |  | 10 |  |  |  |  |
|  | trans-2,3-Dibromo-2-buten-1,4-diol |  |  |  |  | 5 |  |  |  |  | 10 |  |  |  |
| Rosin | Acrylic acid-modified hydrogenated rosin |  |  |  |  |  |  |  |  |  |  | 10 |  |  |
|  | Total | 100 | 100 | 100 | 100 | 100 | 100 | 100 | 100 | 100 | 100 | 100 | 100 | 100 |
| Total amount of monoamide-based thixotropic agents |  | 40 | 40 | 40 | 40 | 40 | 40 | 20 | 20 | 20 | 20 | 20 | 20 | 20 |
| Amount of coumarin/ Total amount of monoamide-based thixotropic agents |  | — | — | — | — | — | 0.13 | 0.5 | 0.5 | 0.5 | 0.5 | 0.5 | — | — |
| Property of suppressing generation of flux residue |  | Poor | Poor | Poor | Poor | Poor | Poor | Poor | Poor | Poor | Poor | Poor | Poor | Poor |
| Property of suppressing occurrence of separation during storage |  | Poor | Poor | Poor | Poor | Poor | Poor | Good | Good | Good | Good | Good | Good | Good |
| Comprehensive evaluation |  | Poor | Poor | Poor | Poor | Poor | Poor | Poor | Poor | Poor | Poor | Poor | Poor | Poor |

As shown in Tables 1 and 2, according to the fluxes of Examples 1 to 24, excellent results were obtained from the viewpoint of separation suppression and the reside rate.

On the other hand, as shown in Table 3, it was found that the fluxes of Comparative Examples 1 to 5 were poor from the viewpoint of separation suppression. The present inventors assume that the reason for this is that no monoamide-based thixotropic agent was added to these fluxes.

As shown in Table 4, it was found that the fluxes of Comparative Examples 6 to 11 were poor from the viewpoint of separation suppression and the residue rate. The present inventors assume that the reason for the occurrence of separation is that coumarin was not added to these fluxes or the content proportion of coumarin was too small. The present inventors assume that the reason for the residue rate becoming high is that the content proportion of the monoamide-based thixotropic agent was too large.

As shown in Table 4, it was found that the fluxes of Comparative Examples 12 to 15 were poor from the viewpoint of the residue rate. The present inventors assume that the reason for this is that, compared with the content proportions of the activator in Examples 14 to 17, those in Comparative Examples 12 to 15 were too large.

As shown in Table 4, it was found that the flux of Comparative Example 16 was poor from the viewpoint of the residue rate. The present inventors assume that the reason for this is that, compared with the content proportion of the rosin in Example 11, that in Comparative Example 16 was too large.

As shown in Table 4, it was found that the fluxes of Comparative Examples 17 and 18 were poor from the viewpoint of the residue rate. The present inventors assume that the reason for this is that the coumarin derivative having a higher boiling point (that is, having lower sublimability) than coumarin was added.

REFERENCE SIGNS LIST

10 Electronic circuit board
11, 22, 23 Electrodes
20, 21 Electronic component
BMP Soldered joint portion
PD Soldered product
PST Solder paste
RDC Reducing gas

The invention claimed is:

1. A flux for soldering, comprising:
    10 to 40 wt % of coumarin;
    5 to 30 wt % of a monoamide-based thixotropic agent; and
    40 to 80 wt % of a solvent.
2. The flux according to claim 1,
    wherein a lower limit of a content proportion of the coumarin is 15 wt %.
3. The flux according to claim 1,
    wherein an upper limit of a content proportion of the coumarin is 25 wt %.
4. The flux according to claim 1,
    wherein a lower limit of a content proportion of the monoamide-based thixotropic agent is 15 wt %.
5. The flux according to claim 1,
    wherein an upper limit of a content proportion of the monoamide-based thixotropic agent is 25 wt %.
6. The flux according to claim 1,
    wherein a content ratio of the coumarin to the monoamide-based thixotropic agent is 0.4 to 8.0.
7. The flux according to claim 1, further comprising:
    more than 0 wt % and 5 wt % or less of an activator.
8. The flux according to claim 1,
    wherein the flux comprises no activator.
9. The flux according to claim 1, further comprising:
    more than 0 wt % and 5 wt % or less of rosin.
10. The flux according to claim 1,
    wherein the flux comprises no rosin.
11. A solder paste comprising:
    a flux for soldering, comprising:
        10 to 40 wt % of coumarin;
        5 to 30 wt % of a monoamide-based thixotropic agent; and
        40 to 80 wt % of a solvent; and
    a solder powder.
12. A method for producing a soldered product, comprising:
    supplying a solder paste comprising:
        a flux for soldering, comprising:
            10 to 40 wt % of coumarin;
            5 to 30 wt % of a monoamide-based thixotropic agent; and
            40 to 80 wt % of a solvent; and
        a solder powder
    to a soldering portion of an electronic circuit board;
    mounting an electronic component onto the soldering portion; and
    heating the soldering portion up to a temperature at which the solder powder melts in a reducing atmosphere containing a reducing gas to join the electronic component and the electronic circuit board.

* * * * *